United States Patent
Volk

[19]

[11] Patent Number: 6,128,359
[45] Date of Patent: Oct. 3, 2000

[54] PHASE DIFFERENCE MAGNIFIER

[75] Inventor: Andrew M. Volk, Granite Bay, Calif.

[73] Assignee: Intel Corporation, Santa Clara, Calif.

[21] Appl. No.: 09/181,034

[22] Filed: Oct. 27, 1998

[51] Int. Cl.$^7$ .................................................. H04L 7/00
[52] U.S. Cl. ........................ 375/371; 327/153; 713/401; 713/500
[58] Field of Search ..................... 375/371, 372, 375/373, 374, 375, 376; 327/3, 141, 147, 153; 711/167; 712/220; 713/400, 401, 500, 600

[56] References Cited

U.S. PATENT DOCUMENTS

| | | | |
|---|---|---|---|
| 5,073,886 | 12/1991 | Sasaki et al. | 369/124.14 |
| 5,459,755 | 10/1995 | Iga et al. | 375/376 |
| 5,945,849 | 8/1999 | Yamamoto | 327/12 |
| 6,000,022 | 12/1999 | Manning | 711/167 |

FOREIGN PATENT DOCUMENTS 357064171 4/1982 Japan .............................. G01R 27/28

OTHER PUBLICATIONS

Advanced Information, "Direct RMC.d1 Data Sheet", Rambus Inc., www.rambus.com, DL0036–00.7, Aug. 1998, pp. 1–104.

*Primary Examiner*—Stephen Chin
*Assistant Examiner*—Chieh M. Fan
*Attorney, Agent, or Firm*—Blakely, Sokoloff, Taylor & Zafman LLP

[57] ABSTRACT

An apparatus and method for indicating a phase difference between a first input signal and a second input signal. A first delayed signal is generated by delaying a reference signal for a first predetermined time and a second delayed signal is generated by delaying the reference signal for a second predetermined time, the second predetermined time being longer than the first predetermined time. The leading signal of the first and second input signals is detected. If the first input signal leads the second input signal, the first delayed signal is output to represent the first input signal and a signal that lags the first delayed signal by a third predetermined time is output to represent the second input signal. If the second input signal leads the first input signal, the second delayed signal is output to represent the first input signal and a signal that leads the second delayed signal by a fourth predetermined time is output to represent the second input signal.

24 Claims, 6 Drawing Sheets

PHASE DIFFERENCE MAGNIFIER

FIELD OF THE INVENTION

The present invention relates to the field of signal processing, and more particularly to detecting and magnifying a phase difference between signals.

BACKGROUND OF THE INVENTION

In modern electronic devices, it is often necessary to transfer data between circuits in different digital clock domains. Although in many cases the clocks in the different domains are entirely unrelated, occasionally the clocks are generated from a common base clock or otherwise have a frequency relationship that may be used to time the transfer of data. In such cases, it is often critical to accurately align the phases of the clocks to provide deterministic timing relationships for data transfer. Unfortunately, accurate phase alignment is difficult in high frequency systems, because even very small sources of timing offset tend to produce proportionally large phase errors.

FIG. 1 is a diagram of a prior art memory system 10 that includes phase alignment logic for maintaining phase alignment between a host clock 16 (HCLK) and a memory clock 17 (MEMCLK). A reference clock generator 12 generates a reference clock 15 and outputs the reference clock 15 to a memory controller 25 and to a memory clock generator 14. The memory clock generator 14 includes a frequency multiplier circuit 21 that multiplies the reference clock 15 to produce a raw memory clock 13. The raw memory clock 13 is forwarded to a phase adjusting circuit 22 which incrementally adjusts the phase of the raw memory clock 13 to produce the memory clock 17. The memory clock 17 is output from the memory clock generator 14 by an output buffer 23 and supplied to a memory array 19 and to the memory controller 25.

The memory controller 25 receives the reference clock 15 and uses it to generate the host clock 16. The memory controller 25 includes host-side control logic 27 which is clocked by the host clock 16 and memory-side control logic 29 which is clocked by the memory clock 17. The host-side control logic 27 responds to memory access requests received from external agents by issuing commands to the memory-side control logic 29 to read and write the memory array 19. The memory-side control logic 29 responds to the commands from the host-side control logic 27 by issuing read and write commands to the memory array 19 via memory interface 42. Data to be written to the memory array 19 is supplied by external agents and forwarded by the host-side control logic 27 to the memory-side control logic 29, which in turn transfers the data to the memory array. Data read from the memory array 19 is forwarded by the memory-side control logic 29 to the host-side control logic 27 which in turn transfers the data to a requesting agent. The memory-side control logic 29 also includes a buffer 40 and dividing circuit 41 for generating a divided version of the memory clock 43. Because the divided version of the memory clock 43 is further divided by other circuitry in the memory controller, clock signal 43 is referred to as a partially divided memory clock 43 (PD MEMCLK).

The memory controller 25 also includes gear ratio logic 31 which includes respective dividers 34 and 36 to divide the host clock 16 and the partially divided memory clock 43 into respective clock signals that have a common frequency, called a beat frequency. The divided host clock 46 (HCDIV) and the divided memory clock 47 (MCDIV) are supplied to the phase adjuster 22 in the memory clock generator 14. The phase adjuster 22 reacts to the divided clock signals 46, 47 by detecting which of the clock signals 46, 47 leads the other and incrementally advancing or retarding the phase of the memory clock 17 accordingly. Using the phase difference between the divided clock signals 46, 47 as feedback, the phase adjuster 22 ideally drives the phase difference between the host clock 16 and the memory clock 17 to zero.

As mentioned above, accurate clock phase alignment becomes difficult in high frequency systems, because even very small sources of timing offset tend to produce proportionally large phase errors. In the prior-art system of FIG. 1, for example, the memory clock generator 14 is typically implemented as a discrete integrated circuit (IC), rather than being integrated with the memory controller 25 on a single IC. Consequently, signal paths from the dividing circuits 34, 36 to the memory clock generator 14 are relatively long and output buffers 37, 38 are typically required to drive the divided clock signals 46, 47 off-chip to the memory clock generator 14. Routing delays in the signal paths from the dividers 34, 36 to the output buffers 37, 38 to the memory clock generator 14 usually must be closely matched, because any offset in these delays tends to produce a corresponding offset between the host clock 16 and the memory clock 17. This imposes significant constraints on the layout of the memory controller IC and on the board-level layout of the signal traces used to carry the divided clock signals 46, 47. Further, the output buffers 37, 38 typically require separate, quiet ground and power supplies to avoid introducing switching noise from adjacent interfaces. Otherwise, the divided clock signals 46, 47 supplied to the phase adjuster 22 may have jitter contributing to the uncertainty of the phase alignment between the memory clock 17 and the host clock 16. Unfortunately, providing a separate power and ground supply requires two additional pins on the memory controller IC, often a scarce and valuable resource. Thus, the need to provide closely matched routing delays and quiet power and ground add to the complexity and expense of memory controller and board-level design. On the other hand, timing offset in the divided clock signals 46, 47 due to lack of care in signal routing or insufficient noise suppression may result in unacceptably small timing margins in the interface between the host clock and memory clock domains.

SUMMARY OF THE INVENTION

A method and apparatus for indicating a phase difference between a first pair of signals are disclosed. The leading signal of the first pair of signals is detected and a second pair of signals is output that indicates which signal of the first pair of signals leads the other. A first signal of the second pair of signals either leads a second signal of the second pair of signals by at least a first predetermined time or trails the second signal of the second pair of signals by at least a second predetermined time according to which signal of the first pair of signals leads the other.

Other features and advantages of the invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which.

DETAILED DESCRIPTION

A circuit for aligning clock signals and other phase-alignable signals is disclosed in various embodiments. A phase shift magnifier is used to detect a phase difference between input clock signals and to indicate the phase difference by outputting clock signals having a phase difference that is magnified relative to the phase difference between the input clock signals. Because the phase difference between the output clock signals is magnified, signal path layout constraints and noise suppression requirements may be relaxed without introducing an undesirable phase offset between the clocks sought to be aligned. This and other intended advantages will be apparent from the following description.

Figure 1:
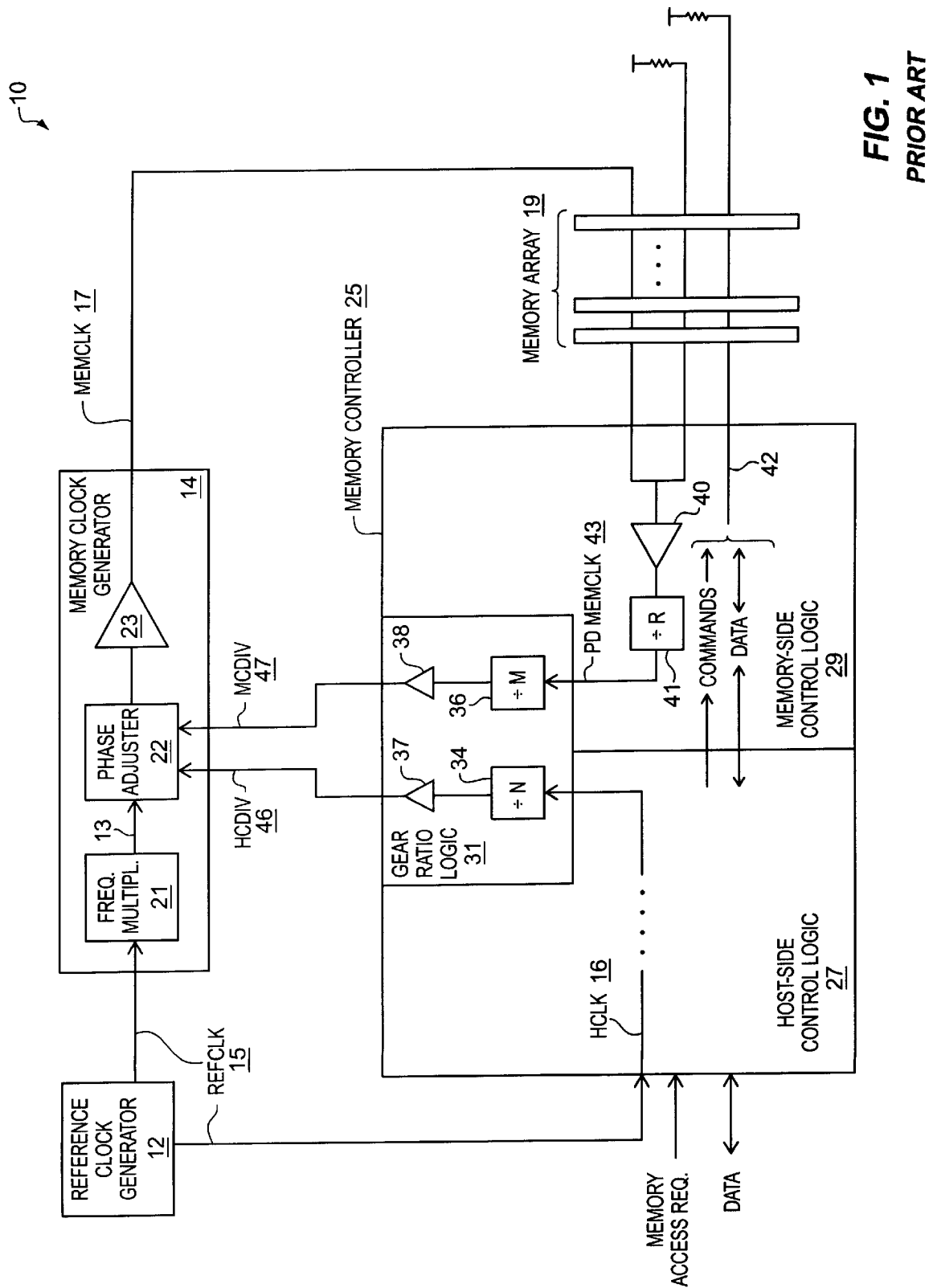
FIG. 1 a block diagram of a prior art circuit for phase aligning a pair of clocks.
Figure 2:
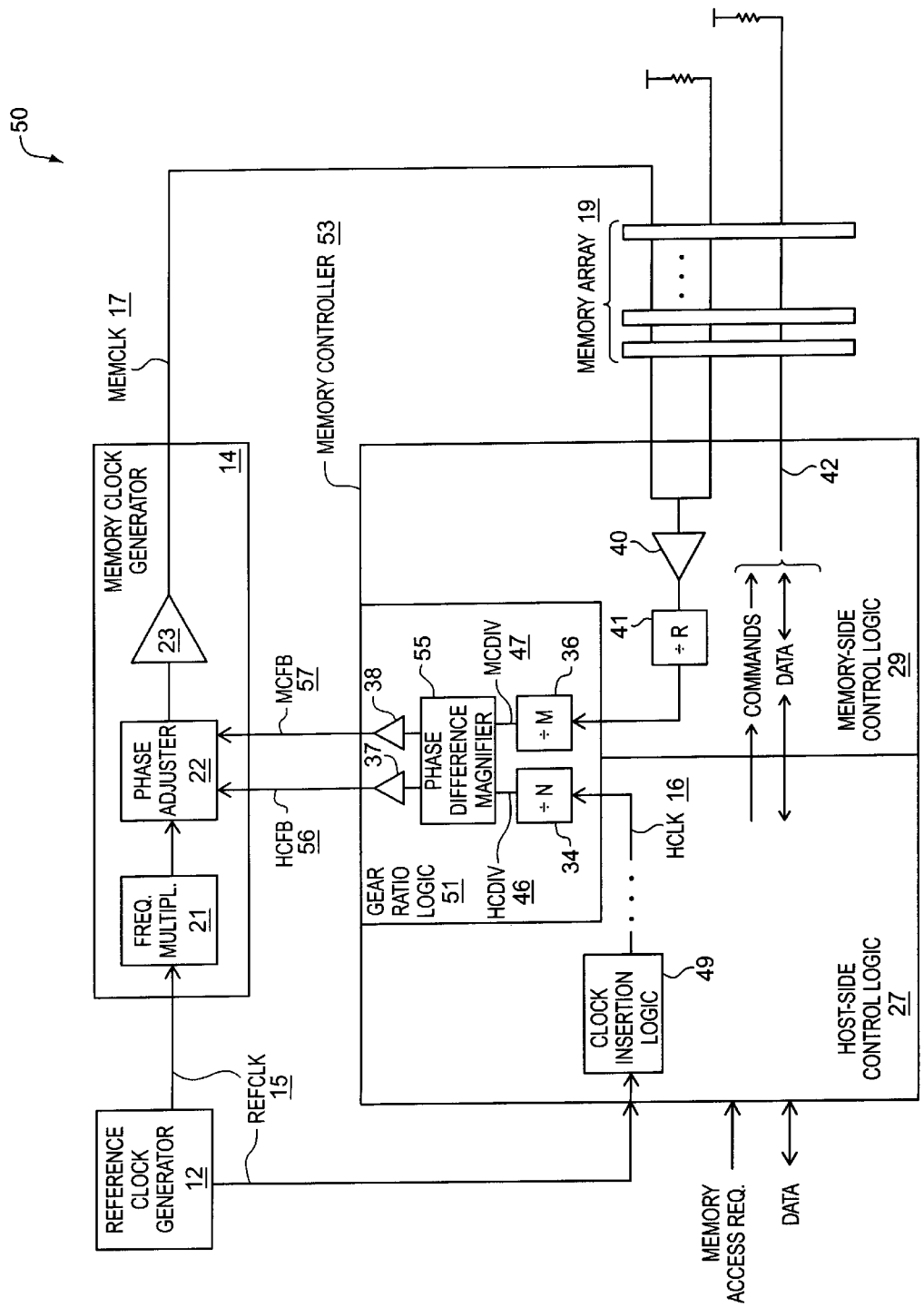
FIG. 2 is a block diagram of a circuit for phase aligning a pair of clocks according to one embodiment.

FIG. 2 is a diagram of a memory system 50 that includes phase alignment logic according to an embodiment of the present invention. The memory system 50 includes a reference clock generator 12, memory clock generator 14 and memory array 19 that each function generally as described above in reference to FIG. 1. The memory system 50 also includes a memory controller 53 having host-side control logic 27 and memory side control logic 29 that also each function generally as described above in reference to FIG. 1. In one embodiment, the host clock 16 is generated from the reference clock 15 by clock insertion logic 49 within the memory controller 25. The clock insertion logic 49 generates the host clock 16 by advancing the phase of the reference clock 15 (e.g., using a phase-locked loop circuit) to cancel delay caused by insertion of the reference clock 15 into the memory controller 25. In alternate embodiments, the host clock 16 may have a different phase relationship to the reference clock 15. Also, in alternate embodiments, subdivided versions of the reference clock 15 (e.g., REFCLK/2) may be supplied to the memory clock generator 14 instead of the reference clock 15 itself.

The memory controller 53 also includes gear ratio logic 51 that has been modified to include a phase difference magnifier 55. The phase difference magnifier 55 receives the divided host clock signal 46 (HCDIV) and the divided memory clock signal 47 (MCDIV) from respective dividing circuits 34, 36 and, in response, generates a host clock feedback signal 56 (HCFB) and a memory clock feedback signal 57 (MCFB) that have a magnified phase difference relative to the phase difference between the divided host clock and divided memory clock signals 46, 47. The host clock feedback and memory clock feedback signals 56, 57 are output to the phase adjuster 22 in the memory clock generator by respective output buffers 37 and 38.

Because the phase difference magnifier 55 is positioned electrically and physically near the dividing circuits 34 and 36, the phase difference magnifier 55 receives the divided host clock and divided memory clock signals 46, 47 before they experience significant routing delays. As discussed below, the phase difference magnifier 55 includes phase detection circuitry for detecting the phase difference between the divided clock signals 46, 47 at this early stage. This is in contrast to prior art techniques in which the divided host clock signals 46, 47 are routed through the output buffers 37, 38 and onto external signal traces before their phase difference is detected by the phase adjusting circuit 22. Further, because the phase difference between the clock feedback signals 56, 57 is magnified relative to the phase difference between the divided clock signals 46, 47, substantially larger phase errors caused by noise and routing delays can be tolerated. Consequently, board and component level layout constraints can be significantly relaxed and the output buffers 37, 38 can be powered using existing on-chip power and ground sources instead of requiring dedicated power and ground pins. Thus, by detecting the phase difference between the divided clock signals 46, 47 at an early stage and by magnifying the phase difference to provide greater noise and routing delay tolerance, accurate phase alignment can be achieved using a less expensive and less constrained design.

Figure 3:
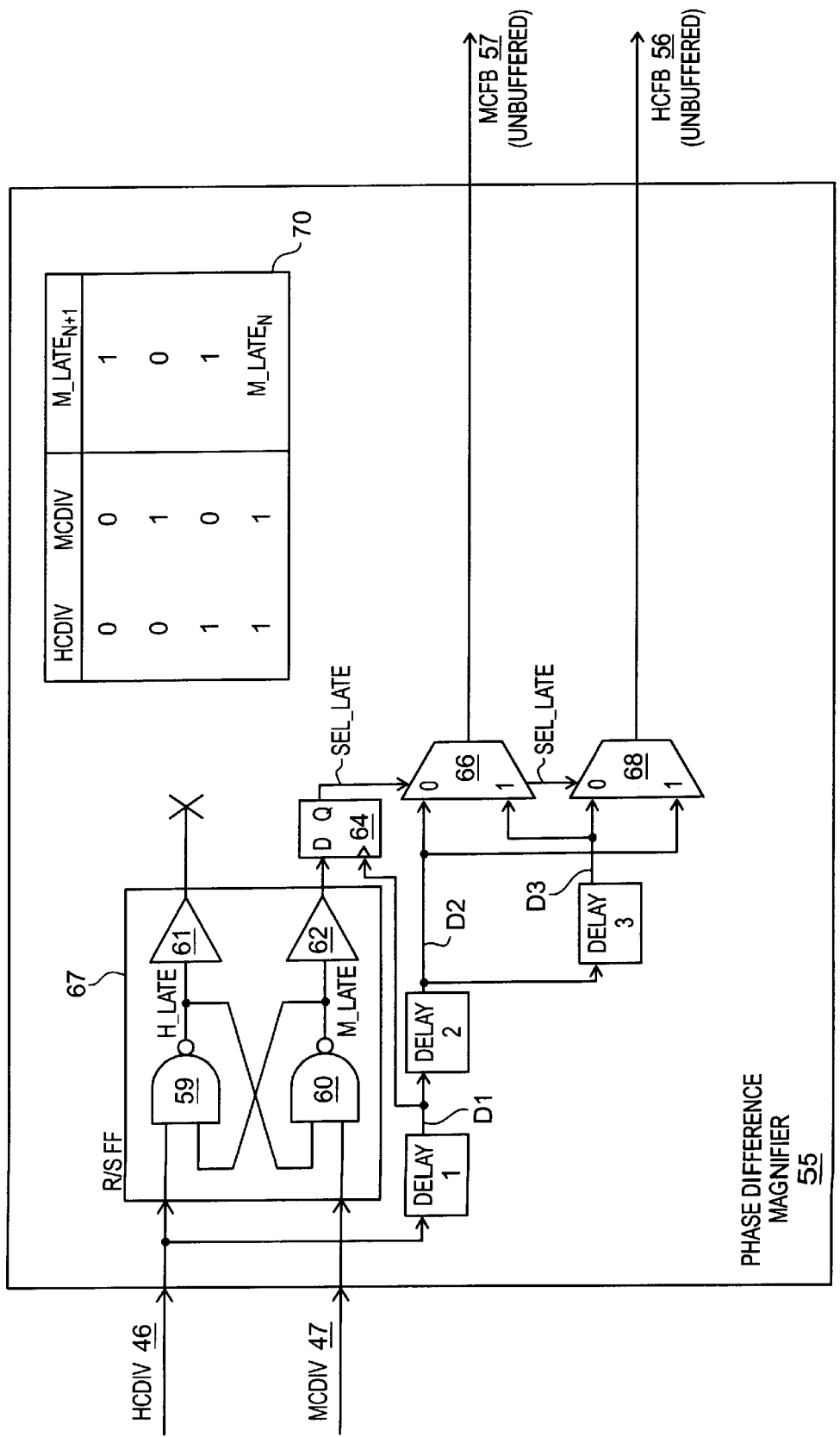
FIG. 3 is a block diagram of a phase shift magnifier according to one embodiment.

FIG. 3 is a block diagram of a phase difference magnifier 55 according to one embodiment. The phase difference magnifier 55 includes a Reset/Set (R/S) flip-flop 67 that functions as a phase detector and that operates according to a truth table 70. Referring to the truth table 70, if a rising edge is detected on the divided memory clock signal (MCDIV) while the divided host clock signal (HCDIV) is low (shown in the truth table as HCDIV=0, MCDIV=1), then a signal called H_LATE will be driven high by NAND gate 59. In response to the high H_LATE signal and the high MCDIV signal, the NAND gate 60 will drive low a signal called M_LATE. Thus, when the MCDIV signal leads the HCDIV signal, M_LATE is driven low and H_LATE is driven high. On the other hand, if the HCDIV signal leads the MCDIV signal, M_LATE is driven high (indicating that MCDIV lags HCDIV) and H_LATE is driven low. After both HCDIV and MCDIV reach a high state, the R/S flip-flop retains the M_LATE and H_LATE signals in respective states that were determined by the low to high transition of the trailing input signal, MCDIV or HCDIV. This is shown in the truth table 70 by the entry indicating that $M\_LATE_{N+1}$ maintains the preceding state of M_LATE (i.e., $M\_LATE_N$) while both HCDIV and MCDIV are high. During the time that MCDIV and HCDIV are both low, referred to herein as a "reset period", M_LATE and H_LATE are both reset to a high state. In one embodiment, H_LATE is not used outside the R/S flip-flop, but M_LATE and H_LATE are both coupled to respective output buffers 61, 62 so that balanced load impedances are presented to the logic gates 59, 60.

In the embodiment shown in FIG. 3, HCDIV is input to a delay element Delay1 to generate a delayed version of the HCDIV signal called D1. D1 is used to gate a D flip-flop 64 that receives M_LATE as an input. In this arrangement, the D flip-flop 64 samples M_LATE a predetermined time after each rising edge of HCDIV and outputs the sampled value as a select signal called SEL_LATE. As discussed below, the predetermined delay introduced by the delay element Delay1 is chosen to provide time for any extended metastable state of the R/S flip-flop 67 to be resolved.

The delayed HCDIV signal, D1, is further delayed by another delay element Delay2 to produce signal D2, and the signal D2 is further delayed by another delay element Delay3 to produce signal D3. Because the D2 and D3 signals have a fixed, predetermined phase difference (i.e., equal to the delay introduced by element Delay3), they can be used to express the phase difference detected between the divided clock signals HCDIV and MCDIV. Depending on the state of the SEL_LATE signal, one of the D2 and D3 signals is selected to be the memory clock feedback signal 57 (MCFB) and the other of the D2 and D3 signals is selected to be the host clock feedback signal 56 (HCFB). Multiplexers 66 and 68 are provided for this purpose, with each of the multiplexers 66, 68 selecting an opposite one of D2 and D3 for a given state of the SEL_LATE signal. For example, if SEL_LATE is high, indicating that the host clock leads the memory clock, then SEL_LATE causes multiplexer 68 to select D2 to be the host clock feedback signal 56 and SEL_LATE causes multiplexer 66 to select D3 to be the memory clock feedback signal 57. Because the phase difference between the divided clock signals HCDIV and MCDIV will tend to be much smaller than the predetermined phase difference between the D2 and D3 signals (due to the closed-loop phase adjustment tending toward a zero phase difference), the effect of outputting the D2 and D3 signals to represent the phase difference between the divided clock signals 46, 47 is to magnify the phase difference in the representative feedback signals 56, 57 and therefore to make the phase difference more impervious to transient events (e.g., noise) and systematic inaccuracies (e.g., unequal routing delays).

Still referring to FIG. 3, note that, because SEL_LATE is generated in response to a rising edge transition of D1 which necessarily precedes a rising edge transition of D2 or D3, the inputs to the multiplexers 66 and 68 will be low during any transition of the SEL_LATE signal. This prevents a glitch in the HCFB and MCFB signals 56, 57 that might otherwise be caused by simultaneous transitioning of the SEL_LATE signal and an input to the multiplexers 66, 68.

A number of changes may be made to the phase difference magnifier 55 of FIG. 3 without departing from the scope of the present invention. For example, other phase detection circuits may be used instead of the R/S flip-flop 67 including, but not limited to, cross-coupled D flip-flops, cross-coupled R/S flip-flops and other sense and hold circuits. Further, the R/S flip-flop itself may be implemented differently (e.g., using NOR gates instead of NAND gates). Also, in other embodiments, other types of storage elements may be used in place of the D flip-flop 64. Also, the Delay2 and Delay3 elements may be clocked by a clock that is not derived from the divided host clock 46. For example, delayed versions of the host clock itself (e.g., signal 16 of FIG. 2), instead of the divided host clock 46, could be output by the phase difference magnifier 55. Also, the divided memory clock 47, or the memory clock itself (e.g., signal 17 of FIG. 2) could be used in an alternate embodiment. Further, as discussed below in reference to FIG. 6, different delay element configurations may be used instead of the configuration shown in FIG. 3. Other implementation details may also be changed without departing from the scope of the present invention.

Figure 4:
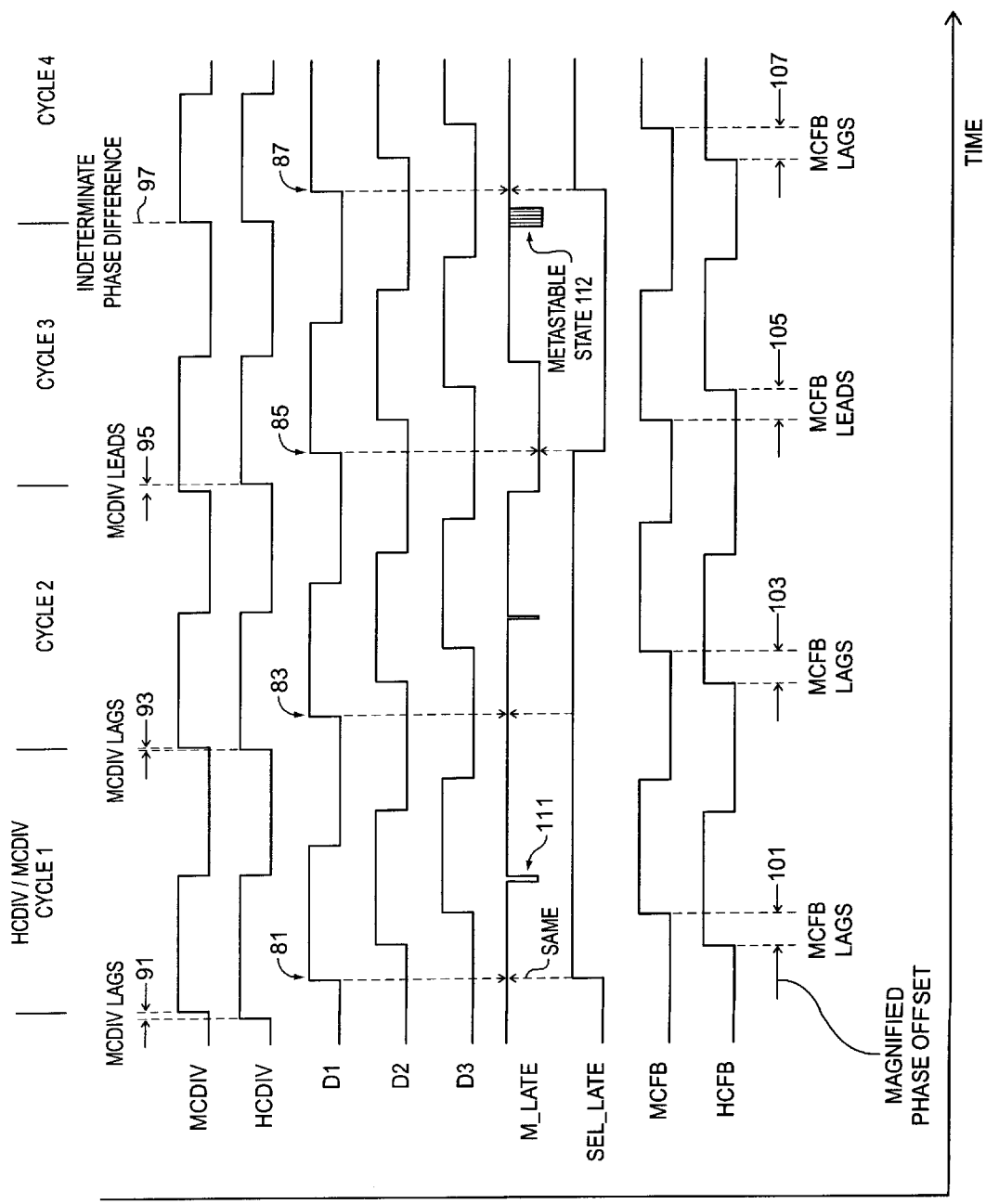
FIG. 4 is a waveform diagram that illustrates the operation of the phase shift magnifier of FIG. 3.

FIG. 4 is a timing diagram that illustrates the operation of a phase difference magnifier according to the embodiment shown in FIG. 3. In a first cycle (Cycle1) of the divided host and memory clocks (HCDIV and MCDIV), HCDIV leads MCDIV. Consequently, M_LATE is driven high and sampled a short time later at the rising edge 81 of signal D1 to cause the SEL_LATE signal to become high. Because SEL_LATE is high, the D2 signal is selected to be HCFB output and the more delayed D3 signal is selected to be the MCFB output. Thus, while there is only a relatively small phase difference 91 between HCDIV and MCDIV, the phase difference is effectively magnified in the output to the phase adjuster as shown by the phase difference 101 by which MCFB lags HCFB.

Still referring to the first cycle of the MCDIV and HCDIV signals shown in FIG. 4, for a brief time MCDIV remains high after HCDIV has transitioned to a low level. Because of this input state, the M_LATE signal briefly goes low and then returns to a high level when MCDIV goes low. This is shown by arrow 111. Because the sample time established by the rising edge 81 of D1 occurs well before the brief low state 111 of M_LATE, the low state 111 of M_LATE caused by the phase offset between the trailing edges of HCDIV and MCDIV does not affect the SEL_LATE signal.

In cycle two (Cycle2) of the HCDIV and MCDIV signals, HCDIV continues to lead MCDIV, but now by a smaller margin. This is expected because, in response to detecting that MCFB lags HCFB, the phase adjusting circuit in the memory clock generator has incrementally advanced the phase of the memory clock signal (e.g., by slightly shortening the time period of a cycle of the memory clock signal). Because HCDIV continues to lead MCDIV in cycle two, the M_LATE signal is driven high and sampled at the rising edge 83 of D1 to also drive the SEL_LATE signal high. Because SEL_LATE is high, the more delayed of the D2 and D3 signals (i.e., D3) is again output to be the MCFB signal, while the more advanced of the D2 and D3 signals (i.e., D2) is output to be the HCFB signal. Thus, while the phase difference 93 between the MCDIV and HCDIV signals has become even smaller, HCFB still leads MCFB by the same magnified phase difference 103 as in the previous cycle.

In cycle three (Cycle3) of the HCDIV and MCDIV signals, MCDIV has been advanced so that it now slightly leads the HCDIV signal. Consequently, the M_LATE signal goes low at the rising edge of MCDIV and remains low at least until it is sampled at the rising edge 85 of D1 to generate a low SEL_LATE signal. Because the SEL_LATE signal is low, the more advanced of the D2 and D3 signals (i.e., D2) is selected to be the MCFB signal and the more delayed of the D2 and D3 signals (i.e., D3) is selected to be the HCFB signal. Thus, MCFB now leads HCFB, but the same magnified phase difference 105 still appears between the MCFB and HCFB signals, despite the relatively small phase difference 95 between the MCDIV and HCDIV signals.

In cycle four (Cycle4) of the HCDIV and MCDIV signals, the MCDIV signal has been slightly retarded such that the MCDIV and HCDIV signals are almost perfectly in phase. The simultaneous (or near simultaneous) low to high transitions of the HCDIV and MCDIV signals gives rise to a metastable state in the R/S flip-flop of the phase difference magnifier. The metastable state is essentially a race condition in the two NAND gates that form the R/S flip-flop to determine which will eventually go high and which will go low (the outputs of both NAND gates cannot remain in the same state when both the HCDIV and MCDIV inputs are high). Until the race condition is resolved, the H_LATE and M_LATE signals are driven to voltage levels somewhere between a valid logic high and a valid logic low. The metastable state is illustrated by the shaded area 112 of the M_LATE signal in FIG. 4. If the metastable state is not resolved by the time M_LATE is sampled at the rising edge of D1, an incorrect state of M_LATE may be captured in the D flip-flop that outputs SEL_LATE. In other words, an incorrect or even invalid SEL_LATE signal may be output to the multiplexers used to route the D2 and D3 signals to the phase adjuster. In one embodiment, this condition is prevented (at least within practical mean failure times), by using high gain amplifiers in the NAND gates (or other logic elements) that make up the R/S flip flop and also by providing a delay element Delay1 that delays the rising edge of D1 for a time considerably longer than the metastable state can reasonably be expected to last. Further, the output buffers (elements 61 and 62 of FIG. 3) in the R/S flip-flop may be designed to have a hysteresis or a predetermined transition threshold (e.g., as in a Schmidt trigger device) such that a metastable signal level at the buffer input will not change the buffer output.

Still referring to cycle four, the metastable state is eventually resolved in favor of the HCDIV signal so that M_LATE is driven high. The M_LATE signal is sampled a brief time later to drive the SEL_LATE signal high and thereby to output D2 as HCFB and D3 as MCFB so that MCFB lags HCFB by the predetermined phase difference between D2 and D3.

Figure 5:
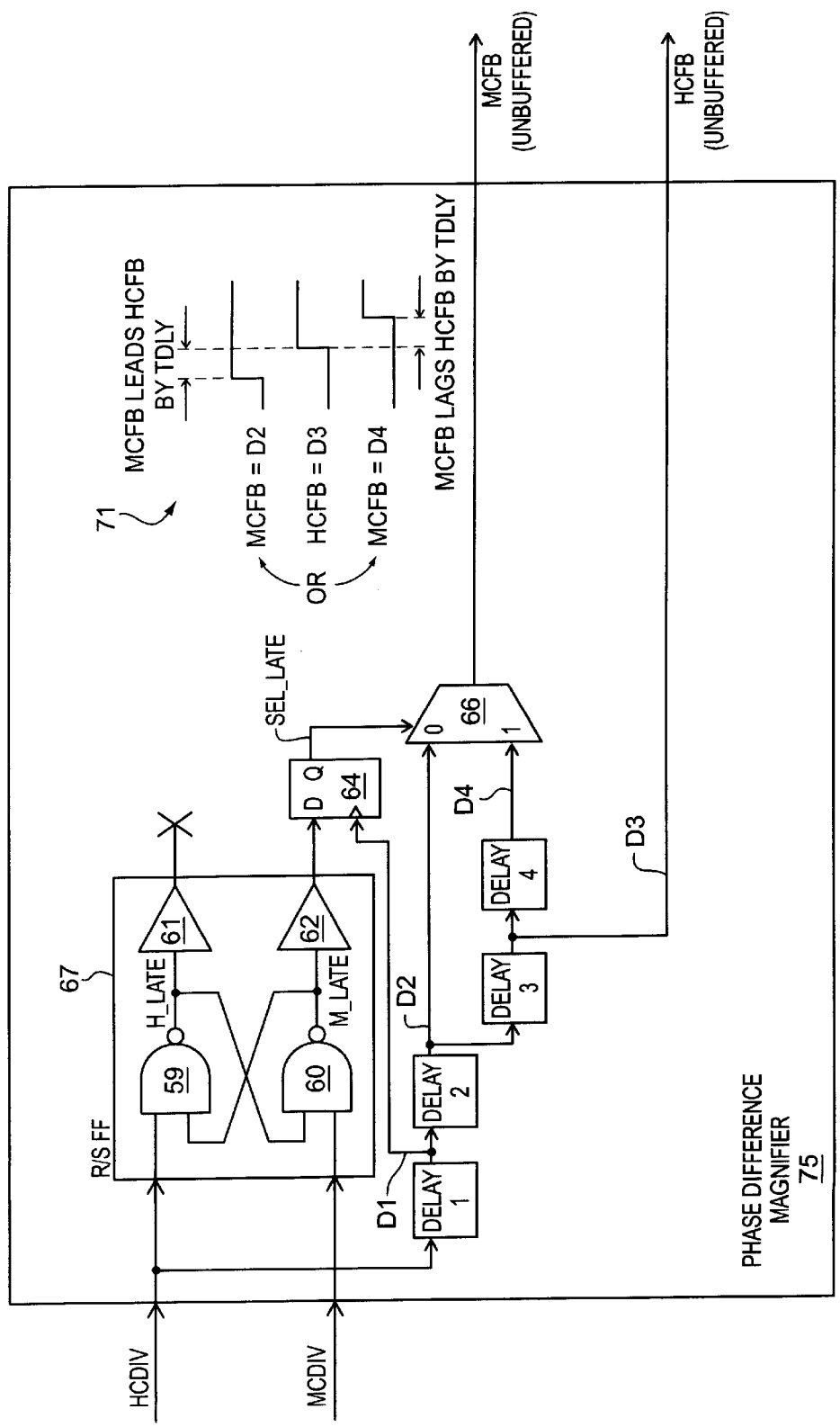
FIG. 5 is a block diagram of a phase shift magnifier according to an alternate embodiment; and, FIG. 6 is a diagram illustrating exemplary alternate configurations of delay elements.

FIG. 5 is a block diagram of an alternate embodiment of a phase difference magnifier 75. The phase difference magnifier 75 includes a Reset/Set (R/S) flip-flop 67, a D flip-flop 64 and a delay element Delay1, each of which functions generally as described in reference to FIG. 3 to produce a SEL_LATE signal. In the embodiment of FIG. 5, the SEL_LATE signal is driven high when the HCDIV signal leads the MCDIV signal, and the SEL_LATE signal is driven low when the MCDIV signal leads the HCDIV signal. As shown, a signal D2 is output by the Delay2 element and provided to a first input of a dual-input multiplexer 66. The D2 signal is also supplied to a delay element Delay3 which outputs a D3 signal. The D3 signal is output to be the host clock feedback signal, HCFB, and is also supplied to a Delay4 element which outputs a D4 signal to the other input of the multiplexer 66. The SEL_LATE is used to select which of the D2 and D4 signals is output by the multiplexer to be the memory clock feedback signal, MCFB. If SEL_LATE is high (indicating that MCDIV lags HCDIV), the D4 signal is selected to be the MCFB signal. If SEL_LATE is low (indicating that MCDIV leads HCDIV), the D2 signal is selected to be the MCFB signal. By using delay elements Delay3 and Delay4 that each introduce a delay time, TDLY, the effect of selecting either the D2 or D4 signal is to select a signal that lags D3 by time TDLY (i.e., D4) or to select a signal that leads D3 by time TDLY (i.e., D2) as shown by the waveform diagram 71 in FIG. 5. Thus, in contrast to the phase difference magnifier 55 of FIG. 3, in which D3 and D4 signals are alternately selected to be the HCFB and MCFB outputs, depending on the state of SEL_LATE, in the phase difference magnifier 75 of FIG. 5, a predetermined signal (e.g., D3) is output as the HCFB signal, and the SEL_LATE signal is used to select between signals that lead or lag the HCFB signal by a predetermined time. In an alternate embodiment, the D3 signal may be output as the MCFB signal and the SEL_LATE signal may be used to select between a leading and lagging signal to be the HCFB output. Also, a signal other than HCDIV may be used as the base clock source for the MCFB and HCFB output signals. Further, although the time delays introduced by the Delay3 and Delay4 elements have been described as being equal, unequal time delays may be used in an alternate embodiment. Also, it may be desirable to introduce an additional delay element between the Delay2 element and the multiplexer to provide time for the output of the D flip-flop to stabilize. These and other implementation details may be changed without departing from the spirit and scope of the present invention.

Figure 6:
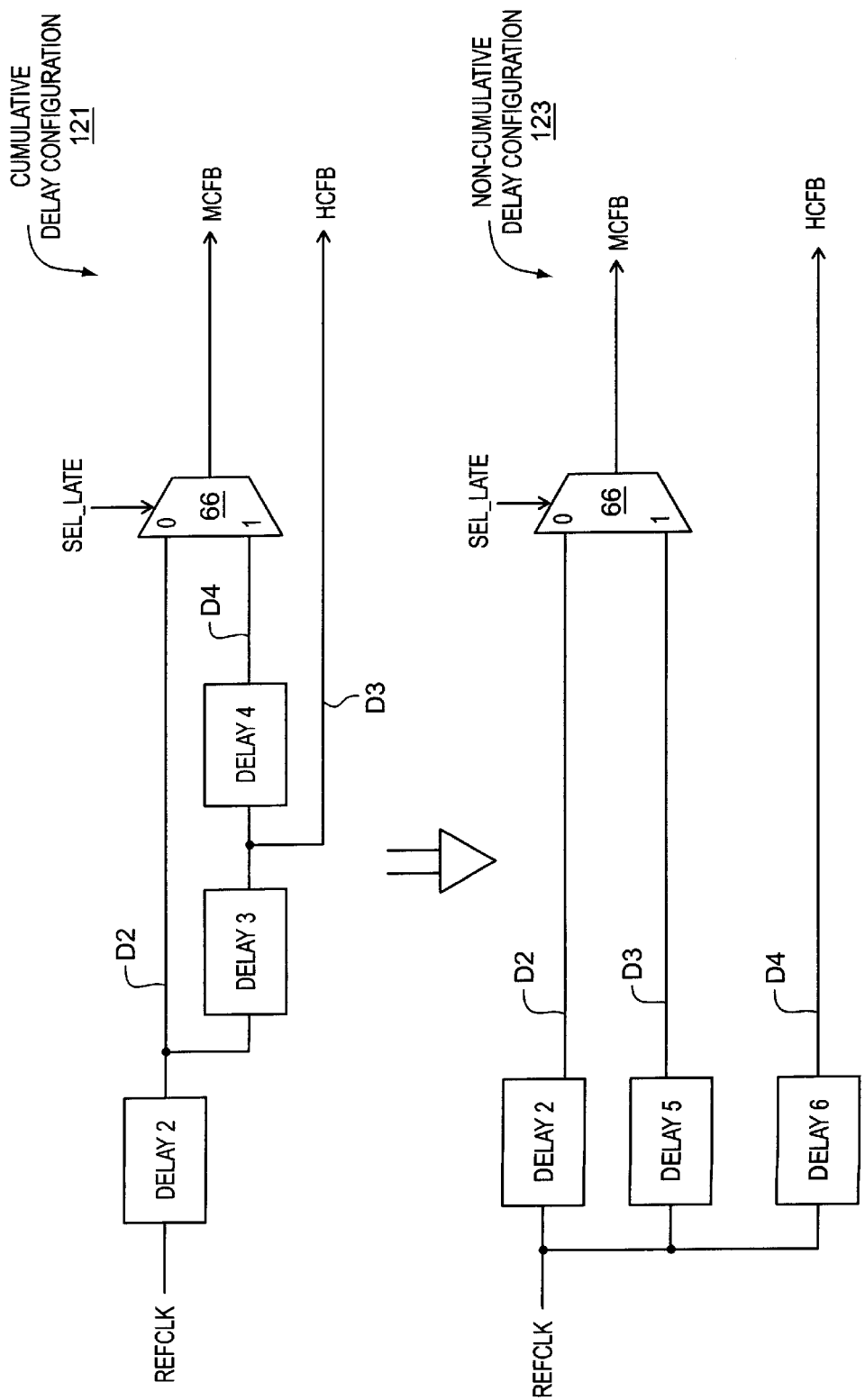

FIG. 6 illustrates alternate delay circuits 121, 123 that may be used in the phase difference magnifier of FIG. 5. The delay circuit 121, referred to as a cumulative delay circuit, is essentially the arrangement shown in FIG. 5, except that a generalized clock, REFCLK, is used to clock the circuit. REFCLK may be the divided host clock HCDIV in a particular embodiment. In the cumulative delay circuit 121, the signal D3 is generated from REFCLK by applying the cumulative delays in elements Delay2 and Delay3. Similarly, the signal D4 is generated from REFCLK by applying the cumulative delays in elements Delay2, Delay3 and Delay4. In the delay circuit 123, referred to as a non-cumulative delay circuit, elements Delay5 and Delay6 are used to produce the D3 and D4 signals, respectively, directly from REFCLK. By choosing delay element Delay5 to produce essentially the same delay as elements Delay2 and Delay3 combined, and by choosing delay element Delay6 to produce essentially the same delay as elements Delay2, Delay3 and Delay4 combined, the non-cumulative delay circuit 123 provides essentially the same functionality as the cumulative delay circuit 121. A non-cumulative delay circuit design may likewise be used instead of the cumulative delay configuration of elements Delay3 and Delay4 in the phase difference magnifier 55 of FIG. 3. Delay elements may be implemented using passive circuit components or any number of well known transistor-based circuits (e.g., a concatenation of buffer amplifiers, with the delay being determined by the number of stages).

Although the embodiments herein relate to aligning clocks in different clock domains of a memory system, application of the present invention is not so limited. The present invention may be applied in any circumstance where it is desirable to align the phase of two or more signals.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. A phase difference magnifier comprising:

a phase detector to detect which signal of a first pair of signals leads the other signal of the first pair of signals;

delay logic to magnify a phase difference between the first pair of signals; and output logic coupled to the delay logic to output a second pair of signals that indicates which signal of the first pair of signals leads the other, including outputting a first signal of the second pair of signals that either leads a second signal of the second pair of signals by at least a first predetermined time or trails the second signal of the second pair of signals by at least a second predetermined time depending on which signal of the first pair of signals leads the other.

2. An apparatus comprising:

means for detecting which signal of a first pair of signals leads the other signal of the first pair of signals;

means for magnifying a phase difference between the first pair of signals by delaying a signal of the first pair of signals to create a second pair of signals; and means, coupled to the means for magnifying, for outputting a second pair of signals that indicates which signal of the first pair of signals leads the other, including outputting a first signal of the second pair of signals that either leads a second signal of the second pair of signals by at least a first predetermined time or trails the second signal of the second pair of signals by at least a second predetermined time depending on which signal of the first pair of signals leads the other.

3. A method comprising:

detecting which signal of a first pair of signals leads the other signal of the first pair of signals;

magnifying a phase difference between the first pair of signals by delaying a signal of the first pair of signals to create a second pair of signals; and outputting the second pair of signals that indicates which signal of the first pair of signals leads the other, including outputting a first signal of the second pair of signals that either leads a second signal of the second pair of signals by at least a first predetermined time or trails the second signal of the second pair of signals by at least a second predetermined time according to which signal of the first pair of signals leads the other, the first predetermined time substantially equal to the second predetermined time;

generating a first delayed signal by delaying a first signal of the first pair of signals by a third predetermined time; and generating a second delayed signal by delaying the first signal of the first pair of signals by a fourth predetermined time, the fourth predetermined time being longer than the third predetermined time, and wherein outputting the second pair of signals that indicates which signal of the first pair of signals leads the other comprises selecting one of the first delayed signal and the second delayed signal to be the first signal of the second pair of signals based on which signal of the first pair of signals leads the other.

4. The method of claim 3 wherein outputting the second pair of signals that indicates which signal of the first pair leads the other further comprises selecting one of the first delayed signal and the second delayed signal not selected to be the first signal of the second pair of signals to be the second signal of the second pair of signals.

5. The method of claim 3 wherein the first predetermined time is established by the difference between the third predetermined time and the fourth predetermined time.

6. The method of claim 3 further comprising:

generating a third delayed signal by delaying the first signal of the first pair of signals by a fifth predetermined time that is longer than the third predetermined time and shorter than the fourth predetermined time; and outputting the third delayed signal to be the second signal of the second pair of signals.

7. The method of claim 6 wherein the first predetermined time is established by the difference between the third predetermined time and the fifth predetermined time and wherein the second predetermined time is established by the difference between the fourth predetermined time and the fifth predetermined time.

8. A method of indicating a phase difference between a first input signal and a second input signal, the method comprising:

generating a first delayed signal by delaying a reference signal by a first predetermined time;

generating a second delayed signal by delaying the reference signal by a second predetermined time, the second predetermined time being longer than the first predetermined time;

detecting which of the first and second input signals leads the other;

outputting the first delayed signal to represent the first input signal and outputting a signal that lags the first delayed signal by a third predetermined time to represent the second input signal, if the first input signal leads the second input signal; and outputting the second delayed signal to represent the first input signal and outputting a signal that leads the second delayed signal by a fourth predetermined time to represent the second input signal, if the second input signal leads the first input signal.

9. The method of claim 8 wherein the reference signal is the first input signal.

10. The method of claim 8 wherein outputting the first delayed signal and a signal that lags the first delayed signal comprises outputting the first delayed signal to represent the first input signal and outputting the second delayed signal to represent the second input signal, the third predetermined time being the difference between the first predetermined time and the second predetermined time.

11. The method of claim 10 wherein outputting the second delayed signal and a signal that leads the second delayed signal comprises outputting the second delayed signal to represent the first input signal and outputting the first delayed signal to represent the second input signal, the fourth predetermined time being the difference between the first predetermined time and the second predetermined time.

12. The method of claim 8 further comprising:

generating a third delayed signal that lags the reference signal by a fifth predetermined time, the fifth predetermined time being greater than the first predetermined time and less than the second predetermined time; and outputting the third delayed signal to represent the second input signal, the third predetermined time being the difference between the first predetermined time and the fifth predetermined time, and the fourth predetermined time being the difference between the second predetermined time and the fifth predetermined time.

13. An apparatus to indicate a phase difference between a first input signal and a second input signal, the apparatus comprising:

a phase detector to detect which of the first and second input signals leads the other and to output a select signal having a first state if the first input signal leads the second input signal and a second state if the second input signal leads the first input signal;

a first delay circuit element having an input to receive a first reference signal and an output to output a first delayed signal that lags the first reference signal by a first predetermined time;

a second delay circuit element having an input to receive a second reference signal and an output to output a second delayed signal that lags the second reference signal by a second predetermined time;

a first multiplexer that includes a control input coupled to receive the select signal from the phase detector and first and second data inputs respectively coupled to receive the first and second delayed signals from the first and second delay circuit elements, the first multiplexer outputting the first delayed signal if the select signal is in the first state and outputting the second delayed signal if the select signal is in the second state; and an output signal path to output a signal that lags the first delayed signal when the select signal is in the first state and that leads the second delayed signal when the select signal is in the second state.

14. The apparatus of claim 13 further comprising a third delay circuit element having an input to receive a third reference signal and an output to output a third delayed signal that lags the first delayed signal by a third predetermined time and that leads the second delayed signal by a fourth predetermined time, and wherein the output signal path is coupled to the third delay circuit to output the third delayed signal.

15. The apparatus of claim 14 wherein the second reference signal is the third delayed signal.

16. The apparatus of claim 14 wherein the third reference signal is the first delayed signal.

17. The apparatus of claim 14 wherein the first, second and third reference signals are the same reference signal.

18. The apparatus of claim 13 further comprising a second multiplexer that includes a control input coupled to receive the select signal from the phase detector, first and second data inputs respectively coupled to receive the first and second delayed signals from the first and second delay circuit elements, and an output coupled to the output signal path, the second multiplexer outputting the second delayed signal on the output signal path if the select signal is in the first state and outputting the first delayed signal on the output signal path if the select signal is in the second state.

19. The apparatus of claim 13 wherein the first reference signal is generated from the first input signal.

20. The apparatus of claim 13 wherein the first and second reference signals are the same reference signal.

21. The apparatus of claim 13 wherein the second reference signal is the first delayed signal.

22. The apparatus of claim 13 wherein the phase detector includes a latch that is set to a first state when the first input signal is at a logic high level and the second input signal is at a logic low level, the latch being reset to a second state when the first input signal is at a logic low level and the second input signal is at a logic high level.

23. The apparatus of claim 22 wherein the latch forms part of a set/reset flip-flop.

24. An apparatus including first and second digital clocks that are operated at different frequencies, the apparatus comprising:

a phase detector to detect which of the first and second clocks leads the other and to output a select signal having a first state if the first clock leads the second clock and a second state if the second clock leads the first clock;

a first delay circuit element having an input to receive a first reference clock and an output to output a first delayed clock that lags the first reference clock by a first predetermined time;

a second delay circuit element having an input to receive a second reference clock and an output to output a second delayed clock that lags the second reference clock by a second predetermined time;

a first multiplexer that includes a control input coupled to receive the select signal from the phase detector and first and second data inputs respectively coupled to receive the first and second delayed clocks from the first and second delay circuit elements, the first multiplexer outputting the first delayed clock if the select signal is in the first state and outputting the second delayed clock if the select signal is in the second state; and an output signal path to output a clock that lags the first delayed clock when the select signal is in the first state and that leads the second delayed clock when the select signal is in the second state.

* * * * *